Figure 1:
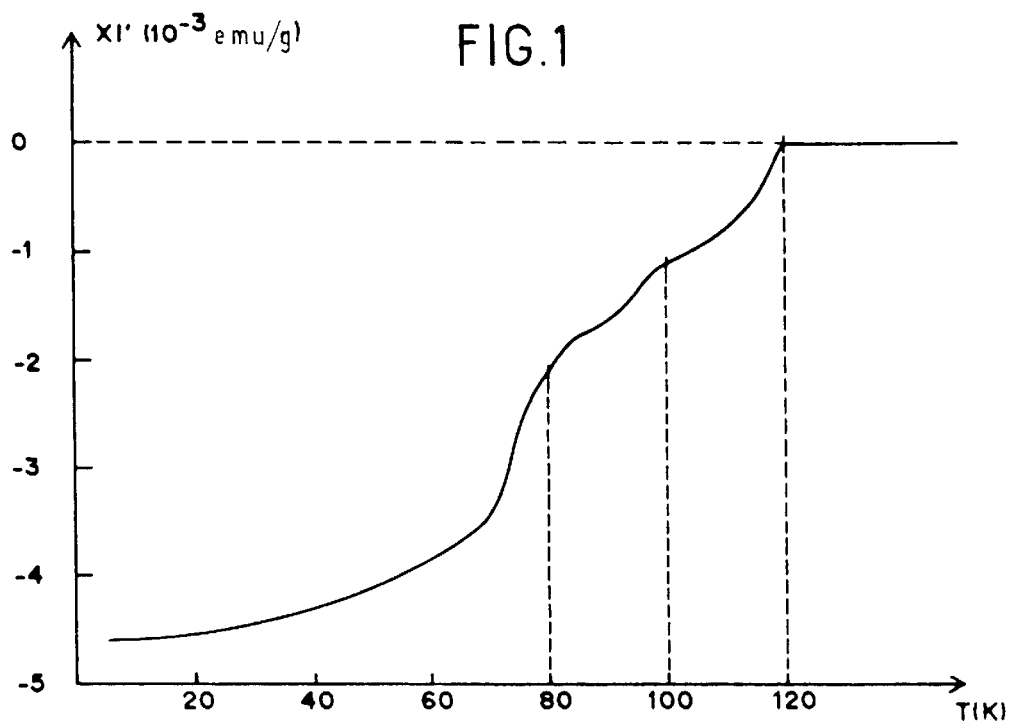

United States Patent [19]

Alario-Franco et al.

[11] Patent Number: 5,952,268
[45] Date of Patent: Sep. 14, 1999

[54] SUPERCONDUCTOR MATERIAL AND A METHOD OF PREPARING SUPERCONDUCTOR MATERIALS

[75] Inventors: Miguel Angel Alario-Franco, Grenoble; Catherine Chaillout, St Etienne de Crossey; Jean-Jacques Capponi, Gieres; Jean-Louis Tholence, Montbonnot St Martin; Bénédicte Souletie, Grenoble, all of France

[73] Assignee: Alcatel, Paris, France

[21] Appl. No.: 08/687,389

[22] PCT Filed: Jan. 19, 1995

[86] PCT No.: PCT/FR95/00059

§ 371 Date: Jul. 23, 1996

§ 102(e) Date: Jul. 23, 1996

[87] PCT Pub. No.: WO95/20550

PCT Pub. Date: Aug. 3, 1995

[30] Foreign Application Priority Data

Jan. 26, 1994 [FR] France ................... 94 01097

[51] Int. Cl.$^6$ .................. C04B 35/057; C04B 35/45; C04B 35/645
[52] U.S. Cl. .................. 505/124; 505/125; 505/482; 505/500; 505/779; 505/785
[58] Field of Search ..................... 505/124, 125, 505/482, 500, 779, 785; 252/521.1

[56] References Cited

PUBLICATIONS

Ihara et al "New High–Tc Superconductor Family of Cu–based . . ." JJAP, vol. 33 (Part 2) No. 4A, Apr. 1994 pp. 503–506 (Abstract).

Ihara et al "More Than Half Way to Room Temperature Superconductors . . . " Electrotech, Lab. Tsukuba, 305, Jun. 1994, 58(6) pp. 448–452 (Abstract).

H. Ihara et al, "New High–$T_c$ Superconductor $Ag_{1-x}Cu_xBa_2Ca_{n-1}Cu_nO_{2n+3\delta}$ Family with $T_c$>117 K", *Japanese Journal of Applied Physics*, vol. 33, No. 3A, Mar. 1, 1994, pp. L300–303.

Wu et al, "Novel Homologous Series of Superconduction Copper Oxides, Cu–129n–1)n", *Physica C*, vol. 223, 1994, pp. 243–248 (No Month).

Wu et al, "Ag distribution in superconducting Ag–Ba–Ca–Cu–O sample", *Physica C*, vol. 224, 1994, pp. 175–178 (No Month).

*Primary Examiner*—Mark Kopec
*Attorney, Agent, or Firm*—Sughrue, Mion, Zinn, Macpeak & Seas, PLLC

[57] ABSTRACT

The present invention relates to method of preparing a superconductor material consisting in preparing a precursor constituted by a powder of $Ba_2Ca_{n-1}Cu_{n+1}O_x$ or $Ba_2Ca_{n-1}Cu_{n+1}O_x$ where n is an integer greater than 1 and x is greater than 2n+2; in mixing said powder with silver oxide power, optionally in the presence of excess copper oxide, in a proportion of one mole of precursor for one to three moles of silver oxide; and in heating to high temperature and high pressure.

10 Claims, 1 Drawing Sheet

5,952,268

SUPERCONDUCTOR MATERIAL AND A METHOD OF PREPARING SUPERCONDUCTOR MATERIALS

BACKGROUND OF THE INVENTION

The present invention relates to superconductors of the high critical temperature ceramic type.

Superconductors are known of the Ba—Ca—Cu—O system such as the $ABa_2Ca_{n-1}Cu_nO_x$ families where n is an integer greater than 1, x is greater than 2n+2, and A is mercury or thallium. Those materials have high critical temperatures, exceeding 100 K for certain phases, i.e. for certain values of n. The critical temperature increases when the material is used at high pressure. For mercury and thallium, it has been observed that the critical temperature increases within a given family with increasing value of n up to n=3, and decreases thereafter.

Those materials are manufactured in the form of ceramics by taking a mixture of precursors in substantially stoichiometric proportion with excess oxygen and subjecting it to high temperatures and pressures.

In spite of the highly advantageous properties represented by compounds of the Hg—Ba—Ca—Cu—O and Tl—Ba—Ca—Cu—O type, research is continuing to find other high critical temperature superconductor ceramics, firstly in the hope of reaching even higher critical temperatures, and secondly for the purpose of avoiding the use of highly toxic substances such as thallium, and to a lesser but non-negligible degree, mercury.

OBJECTS AND SUMMARY OF THE INVENTION

Thus, the present invention provides a superconductor material of the A—Ba—Ca—Cu—O family in which A is copper. The present invention also proposes a method of manufacturing superconductor ceramics starting from a precursor of the Ba—Ca—Cu—O type in substantially stoichiometric proportion for forming $CuBa_2Ca_{n-1}Cu_nO_x$ and silver oxide. A superconductor ceramic is thus obtained comprising grains having the above-specified formula plus grains of silver metal. Nevertheless, in the present state of research, it is not impossible that silver atoms are present in the superconductor grains and contribute to obtaining the superconductive qualities of the compound as explained below.

These objects, characteristics, and advantages, together with others of the present invention are described in detail in the following description of particular embodiments given with reference to accompanying FIGS. 1 to 4 which are graphs showing magnetic susceptibility as a function of temperature for the substances obtained by the method of the present invention.

The inventors have prepared ceramic samples at high pressure (greater than 4 GPa) and at high temperature (850° C. to 1000° C., and preferably 900° C. to 950° C.) using a belt type pressurizing appliance. A precursor of the nominal composition $Ba_2Ca_{n-1}Cu_{n+1}O_x$ or $Ba_2Ca_{n-1}Cu_nO_x$ was prepared in the manner indicated in the article by Antipov et al., Physica C, 215, 1 (1993). More generally, the precursor could be obtained by mixing oxidized compounds in powder form such as oxides, nitrates, or carbonates of barium, calcium, and copper in the specified proportions, said operation being implemented under an atmosphere of oxygen at atmospheric pressure and at a temperature lying in the range 850° C. to 950° C. for a period of several hours. The resulting precursor is hygroscopic and must be conserved under an atmosphere of oxygen or under an inert atmosphere.

In parallel, silver oxide, AgO or $Ag_2O$ or a mixture thereof, was synthesized.

The silver oxide and the precursor (optionally together with excess copper oxide) were finely ground and mixed prior to being placed in the above-mentioned synthesizer system.

In conventional manner, the pressure was initially increased to a value of about 5 GPa, and then the temperature was increased up to the desired value substantially in one hour. Thereafter, temperature and pressure were maintained for more than one hour.

After returning to normal temperature and pressure, a ceramic block was obtained comprising grains having a size of about 100 micrometers and they were identified by X-ray diffraction as being made up of various phases of $CuBa_2Ca_{n-1}Cu_nO_x$, for n lying in the range 1 to 6. Nevertheless, it is possible that the resulting material also contained members of the family for n greater than 6. The resulting block also contained grains of silver or of silver compounds of a size smaller than 10 micrometers. It can thus be considered that the silver served essentially as a catalyst for obtaining $CuBa_2Ca_{n-1}Cu_nO_x$, although it is not impossible that very small quantities of silver atoms remain in each of the ceramic grains, possibly contributing to their superconductive properties. Broadly, ignoring the presence of grains of silver, a structure obtained was substantially as described by S. N. Putilin et al. in Nature 362, 226 (1993) and by E. V. Antipov et al. in Physica C, 215, 1 (1993) but in which mercury is replaced by copper.

EXAMPLE 1

A compound was prepared in application of the above general indications and in which, more particularly, the high pressure ceramic preparation stage was performed at a pressure of 4 GPa (40 kbars) at a temperature of 850° C. for one and a half hours.

The precursor was in the form of a finely ground powder of $Ba_2Ca_2Cu_3O_x$ and one unit of precursor was mixed with two units of silver oxide AgO, likewise in powder form.

The magnetic susceptibility measurements performed on the resulting substance are shown in FIG. 1. XI' magnetic susceptibility was obtained in electromagnetic units (emu/g) as shown in FIG. 1. It can be seen that diamagnetism remained zero substantially up to 120 K, that diamagnetism appeared substantially at 120 K, and that the curve of diamagnetism has discontinuities at about 95 K and at about 77 K. This indicates that the resulting ceramic contains three superconductor compounds having respective critical temperatures of 120 K, 95 K, and 77 K.

Although this has not yet been demonstrated with certainty, the inventors believe that these three critical temperatures correspond to compounds for which the values of n correspond most likely to 3, 4, 5, or 6.

EXAMPLE 2

Under the same conditions of pressure and temperature as in Example 1, $Ba_2Ca_2Cu_3O_x$ was used as precursor as one proportion of precursor was mixed with two proportions of AgO and one proportion of CuO.

Figure 2:
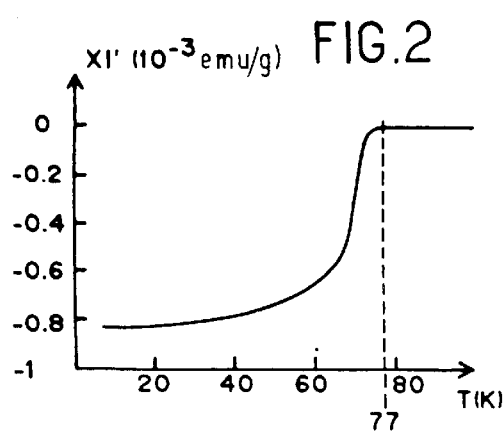

The curve of magnetic susceptibility as a function of temperature is given in FIG. 2. It can be seen that there is a superconductive transition at a temperature of 77 K, the phase of the superconductor compound having been identified as the phase for which n=3.

EXAMPLE 3

Under the same conditions of pressure and temperature as in Example 1, the precursor used was $Ba_2Ca_2Cu_3O_x$ which was mixed with one proportion of $Ag_2O$.

Figure 3:
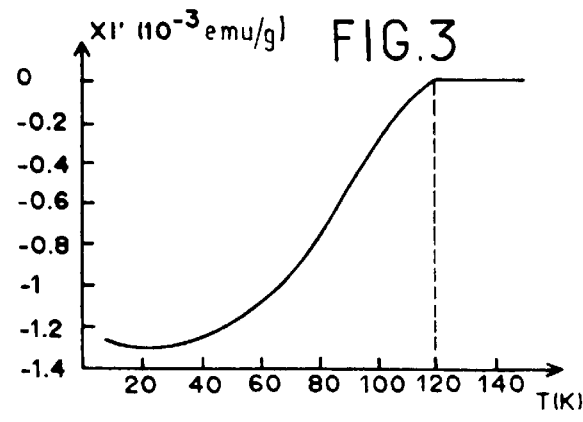

The curve of magnetic susceptibility as a function of temperature is given in FIG. 3. It can be seen that the superconducting transition appears at a temperature of 120 K. In the present state of measurements, it is assumed that this compound corresponds to the phase n=4 or 5.

EXAMPLE 4

Under the same conditions of pressure and temperature as in Example 1, the precursor used was $Ba_2Ca_2Cu_4O_x$ which was mixed with two proportions of AgO.

Figure 4:
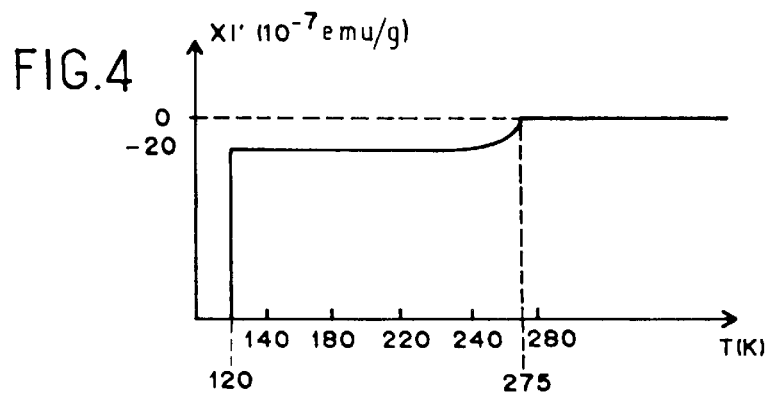

The magnetic susceptibility curve given in FIG. 4 has a marked transition at 120 K, as does the curve of FIG. 3. However, when this magnetic susceptibility is observed on a much larger scale, it can be seen that a step appears at a temperature of 275 K, i.e. +2C°. Similar experiments at high sensitivity were not performed for the samples of FIGS. 1, 2, and 3, and it is not impossible that similar results could also appear in those samples.

The phase corresponding to the material having this very high critical temperature has not been accurately identified, but at present it is believed that it is a material for which the phase n is high (of the order of 6 or more). Also, this high critical temperature value may be due to silver atoms being maintained within the superconductor phase.

Thus, the method of the present invention makes it possible to obtain a superconductor compound whose main formula is $CuBa_2Ca_{n-1}Cu_nO_x$, but more generally the present invention covers any substance obtained by the method described which consists in manufacturing a ceramic under high pressure and high temperature from a precursor or a mixture of precursors of $Ba_2Ca_{n-1}Cu_{n+1}O_x$ in the presence of silver to form a superconductor material having a high critical temperature. The compound may include excess calcium and may be deficient in barium in application of the formula $CuBa_{2-y}Ca_{n-1+y}Cu_nO_x$ where y lies in the range 0 to 0.5.

It may be observed that the composition of the precursor may be modified and that it is not necessarily strictly stoichiometric. Also, varying quantities of silver oxide may be provided, commonly lying in the range one to three moles of silver oxide per mole of precursor.

We claim:

1. A method of preparing a superconductor material comprising the following steps:

preparing a precursor consitituted by a powder of $Ba_2Ca_{n-1}Cu_{n+1}O_x$ or $Ba_2Ca_{n-1}Cu_nO_x$ where n is an integer greater than 1 and x is greater than 2n+2;

mixing said powder with silver oxide power, optionally in the presence of excess copper oxide, in a proportion of one mole of precursor for one to three moles of silver oxide; and heating to high temperature and high pressure.

2. The method of claim 1, oxidized compounds selected from the group consisting of oxides, nitrates, or carbonates of barium, calcium, or copper in the specified proportions, and heating under oxygen at atmospheric pressure for several hours.

3. A method according to claim 1, wherein the silver oxide is selected from the group consisting of AgO or $Ag_2O$.

4. A method according to claim 1, wherein the step of heating to high temperature and high pressure is performed at a pressure greater than about 4 GPa and at a temperature greater than 850° C.

5. A method according to claim 4, wherein said temperature is from about 900° C. to about 950° C.

6. A method according to claim 4, wherein said temperature is less than 1000° C.

7. A method according to claim 4, wherein said temperature is from about 850° C. to about 1000° C.

8. A superconductor material of the $ABa_2Ca_{n-1}Cu_nO_x$ type where n is an integer greater than 1 and where x is greater than 2n+2, wherein A is copper and wherein the material includes traces of silver.

9. A superconductor material according to claim 8, wherein n is greater than or equal to 3.

10. A superconductor material of the formula $CuBa_{2-y}Ca_{n-1+y}Cu_nO_x$ where n is an integer greater than 1 and where x is greater than 2n+2 and wherein the material includes traces of silver, and including excess calcium and a deficit of barium in application of the formula $CuBa_{2-y}Ca_{n-1+y}Cu_nO_x$ where y lies in the range 0 to 0.5.

* * * * *